United States Patent [19]

Vasudev et al.

[11] Patent Number: 5,411,824
[45] Date of Patent: May 2, 1995

[54] PHASE SHIFTING MASK STRUCTURE WITH ABSORBING/ATTENUATING SIDEWALLS FOR IMPROVED IMAGING

[75] Inventors: Prahalad K. Vasudev; Kah K. Low, both of Austin, Tex.

[73] Assignee: Sematech, Inc., Austin, Tex.

[21] Appl. No.: 257,424

[22] Filed: Jun. 9, 1994

Related U.S. Application Data

[63] Continuation of Ser. No. 7,638, Jan. 21, 1993, abandoned.

[51] Int. Cl.⁶ .................................................. G03F 9/00
[52] U.S. Cl. ........................................... 430/5; 430/323
[58] Field of Search ................... 430/5, 323, 22, 269, 430/311, 321

[56] References Cited

U.S. PATENT DOCUMENTS

| | | | |
|---|---|---|---|
| 3,604,778 | 9/1971 | Burckhardt | 350/3.5 |
| 4,013,338 | 3/1977 | Sato et al. | 350/3.5 |
| 4,037,918 | 7/1977 | Kato | 350/3.5 |
| 4,068,018 | 1/1978 | Hashimoto et al. | 427/38 |
| 4,119,483 | 10/1978 | Hubsch et al. | 156/655 |
| 4,174,219 | 11/1979 | Andres et al. | 430/321 |
| 4,248,948 | 2/1981 | Matsuda | 430/5 |
| 4,360,586 | 11/1982 | Flanders et al. | 430/321 |
| 4,374,911 | 2/1983 | Hartley | 430/5 |
| 4,377,627 | 3/1983 | Vinton | 430/22 |
| 4,402,600 | 9/1983 | Araihara | 355/125 |
| 4,411,972 | 10/1983 | Narken et al. | 430/5 |
| 4,414,317 | 11/1983 | Culp et al. | 430/4 |
| 4,434,224 | 2/1984 | Yoshikawa et al. | 430/323 |
| 4,440,840 | 4/1984 | Yamaguchi | 430/4 |
| 4,529,686 | 7/1985 | Kraus | 430/314 |
| 4,575,399 | 3/1986 | Tanaka et al. | 156/272.6 |
| 4,686,162 | 8/1987 | Stangl et al. | 430/5 |
| 4,806,442 | 2/1989 | Shirasaki et al. | 430/4 |
| 4,806,454 | 2/1989 | Yoshida et al. | 430/321 |
| 4,842,969 | 6/1989 | Kawatsuki et al. | 430/5 |
| 4,852,973 | 8/1989 | Durnin et al. | 350/162 |
| 4,871,630 | 10/1989 | Giammarco et al. | 430/14 |
| 4,881,257 | 11/1989 | Nakagawa | 378/35 |
| 4,885,231 | 12/1989 | Chan | 430/321 |
| 4,890,309 | 12/1989 | Smith et al. | 378/35 |
| 4,902,899 | 2/1990 | Lin et al. | 250/492 |
| 4,935,334 | 6/1990 | Boettiger et al. | 430/322 |
| 4,939,052 | 7/1990 | Nakagawa | 430/5 |
| 4,997,747 | 3/1991 | Yoshida et al. | 430/321 |
| 5,024,726 | 6/1991 | Fujiwara | 156/653 |
| 5,045,417 | 9/1991 | Okamoto | 430/5 |
| 5,079,113 | 1/1992 | Ohta et al. | 430/5 |
| 5,153,083 | 10/1992 | Garofalo et al. | 430/5 |
| 5,208,125 | 5/1993 | Lowrey et al. | 430/5 |
| 5,217,830 | 6/1993 | Lowrey | 430/5 |
| 5,219,686 | 6/1993 | Kamon | 430/5 |
| 5,225,035 | 7/1993 | Rolfson | 156/643 |
| 5,229,230 | 7/1993 | Kamon | 430/5 |

FOREIGN PATENT DOCUMENTS

| | | |
|---|---|---|
| 0395425 | 10/1990 | European Pat. Off. . |
| 447132A1 | 8/1991 | European Pat. Off. . |
| 470707A3 | 2/1992 | European Pat. Off. . |
| 0475694 | 3/1992 | European Pat. Off. . |
| 126361 | 7/1977 | Germany . |
| 61-292643 | 12/1986 | Japan . |
| 62-67514 | 3/1987 | Japan . |
| 62-50811 | 10/1987 | Japan . |
| 62-59296 | 12/1987 | Japan . |
| 63-80258 | 4/1988 | Japan . |
| 1-147458 | 6/1989 | Japan . |
| 2-78216 | 3/1990 | Japan . |
| 2-140743 | 5/1990 | Japan . |
| 3-252659 | 11/1991 | Japan . |

OTHER PUBLICATIONS

Patent Abstracts of Japan, vol. 17, No. 257, (E-1368) May 20, 1993, & JP,A,05 003 146 (Hitachi Ltd) 8 Jan. 1993.

(List continued on next page.)

Primary Examiner—S. Rosasco
Attorney, Agent, or Firm—William W. Kidd

[57] ABSTRACT

A phase shifting mask has phase shifters in which the sidewalls of the shifters are coated with a light absorbing or attenuating material. The light absorption at the sidewalls reduces the edges scattering and improves the resolution by obtaining similar transmission profiles from phase shifted and unshifted regions of the PSM.

16 Claims, 3 Drawing Sheets

OTHER PUBLICATIONS

IBM Technical Disclosure Bulletin, vol. 29, No. 3, Aug. 1986, NY, US, p. 1328, 'Method to Produce Sizes in Openings in Photo Images Smaller than Lithographic Minimum Size'.

Patent Abstracts of Japan, vol. 16, No. 382, (P-14382) Aug. 14, 1992 & JP,A,04 123 060 (Fujitsu Ltd) 23 Apr. 1992 see abstract.

IBM Technical Disclosure Bulletin, vol. 25, No. 12, May 1983, NY US, pp. 6408–6414, 'Optical Recording Disc System and Memory Medium,' p. 6408.

International Conference on Microlithography, Rome, Italy, 17–19 Sep. 1991, 79–85 ISSN 0167–9317, pp. 79–86, Lin BJ 'The optimum numerical aperture for attenuated phase-shifting masks'.

"Four More Significant Japanese Advances in Phase Shifting Technology," Semiconductor International, Dec. 1991, p. 16.

"Improved resolution of an i-line stepper using a phase-shifting mask," Tsuneo Terasawa et al., J. Vac. Sci. Technol. B 8(6) Nov./Dec. 1990, pp. 1300–1308.

"Fabrication of 64M Dram with i-Line Phase-Shaft Lithography," K. Nakagawa et al., IEEE, Apr. 1990, pp. 817–820.

"Conjugate Twin-Shifter for the New Phase Shift Method to High Resolution Lithography," H. Ohtsuka et al., SPIE, vol. 1463, Optical/Laser Microlithography IV (1991), pp. 112–123.

"Exploration of Fabrication Techniques for Phase-Shifting Masks", A. K. Pfau et al., SPIE, vol. 1463, Optical/Laser Microlithography IV (1991), pp. 124–134.

"Transparent phase shifting mask with multistage phase shifter and comb-shaped shifter," Hisashi Watanabe et al., SPIE, vol. 1463, Optical/Laser Microlithography IV (1991), pp. 101–110.

"Phase-Shifting Mask and FLEX method for advanced Photo-lithography," Hiroshi Fukuda et al., SPIE, vol. 1264, Optical/Laser Microlithography III (1990), pp. 14–25.

"The Phase-Shifting Mask II: Imaging Simulations & Submicrometer Resist Exposures," Marc D. Levenson et al., IEEE, vol. ED-31, No. 6, Jun. 1984, pp. 753–763.

"Transparent Phase Shifting Mask," H. Watanabe et al., IEEE, Apr. 1990, pp. 821–824.

"A 5.9 $\mu m^2$ Super Low Power SRAM Cell Using a New Phase–Shift Lithography," T. Yamanaka et al., IEEE, Apr. 1990, pp. 477–480.

"Phase–Shift Mask Utilizing Silicon Oxy–Nitride as a Low Reflectivity Phase–Shift Layer," IBM Technical Disclosure Bulletin, vol. 34, No. 10B, Mar. 1992, pp. 360–361.

"Bilayer Metallic Antireflection Mirror," IBM Technical Disclosure Bulletin, vol. 25, No. 1, Jun. 1982, pp. 48–50.

Patent Abstracts of Japan, Publication Number JP060637, Feb. 26, 1992, App. No. JP900172150, vol. 16, No. 252, Kitano Naoki, "Phase Shift Mask and Production Thereof".

"Fabrication of phase-shifting masks with shifter overcoat," R. L. Kostelak et al., 8257b Journal of Vacuum Science & Technology B, 9(1991) Nov./Dec., No. 6, New York, US, pp. 3150–1354.

"The Attenuated Phase-Shifting Mask," Burn J. Lin, Solid State Technology Jan. 1992, pp. 43–47.

"Edge Effects in Phase-shifting Masks for 0.25 um Lithography," Alfred K. Wong and Andrew R. Neureuther, SPIE, vol. 1809, Aug. 1993, pp. 222–228.

"Phase Shift Masking Traced to 1976 Patent", Semiconductor International, Jun. 1993, pp. 32–34.

"Improving Resolution in Photolithography with a Phase-Shifting Mask", Marc D. Levenson et al., IEEE Transactions on Electron Devices, vol. ED-29, No. 12, Dec. 1982, pp. 1828–1836.

"0.2 $\mu m$ or Less I–Line Lithography By Phase–Shifting–Mask Technology", Hideyuki Jinbo and Yoshio Yamashita, Semiconductor Technology Lab, Oki Electric Industry Co., Japan, IEDM 90 (1990) pp. 825–828.

"Sub–Half–Micron i–Line Lithography by Use of LMR–UV Resist", Hideyki Jinbo et al., Japanese Journal of Applied Physics, vol. 28, No. 10, Oct., 1989, pp. 2053–2057.

"Subhalf-micron patterning of negative working resist by using new phase-shifting masks", Hideyki Jinbo et al., Journal of Vacuum Science & Technology B, Second Series, vol. 8, No. 6, Nov./Dec. 1990, pp. 1745–1748.

(List continued on next page.)

OTHER PUBLICATIONS

"0.3-micron optical lithography using a phase-shifting mask", Tsuneo Terasawa et al., SPIE, vol. 1088 Optical/Laser Microlithography II (1989), pp. 25–32.

"What IS a Phase-Shifting Mask?", Marc D. Levenson, SPIE, vol. 1496, 10th Annual Symposium on Microlithography (1990), pp. 20–26.

"Phase-Shifting and Other Challenges in Optical Mask Technology", Burn J. Lin, SPIE, vol. 1496, 10th Annual Sumposium on Microlithography (1990) pp. 54–79.

"Modeling Phase Shifting Masks", Andrew R. Neureuther, SPIE, vol. 1496, 10th Symposium on Microlithography (1990), pp. 80–88.

"New phase-shifting mask with highly transparent $SiO_2$ phase shifters," I. Hanyu et al., SPIE Proceedings, vol., 1264, pp. 167, 1990.

"New Phase Shifting Mask with Self-aligned Phase Shifters for a Quarter Micron Photolithography," IEEE, A. Nitayama et al., IEDM Proceedings, IEDM-89, pp. 57–60, 1989.

"The Optimum Numerical Aperture for Optical Projection Microlithography" B. J. Lin et al., SPIE Proceedings, vol. 1463, pp. 42–53, 1991.

"The optimum numerical aperture for attenuated phase-shifting masks," B. J. Lin, Microelectronic Engineering 17 (1992) pp. 79–86.

"A critical examination of submicron optical lithography using simulated project images," Alan E. Rosenbluth et al., J. Vac. Sci. Technol. B1(4) Oct.–Dec. 1983, pp. 1190–1195.

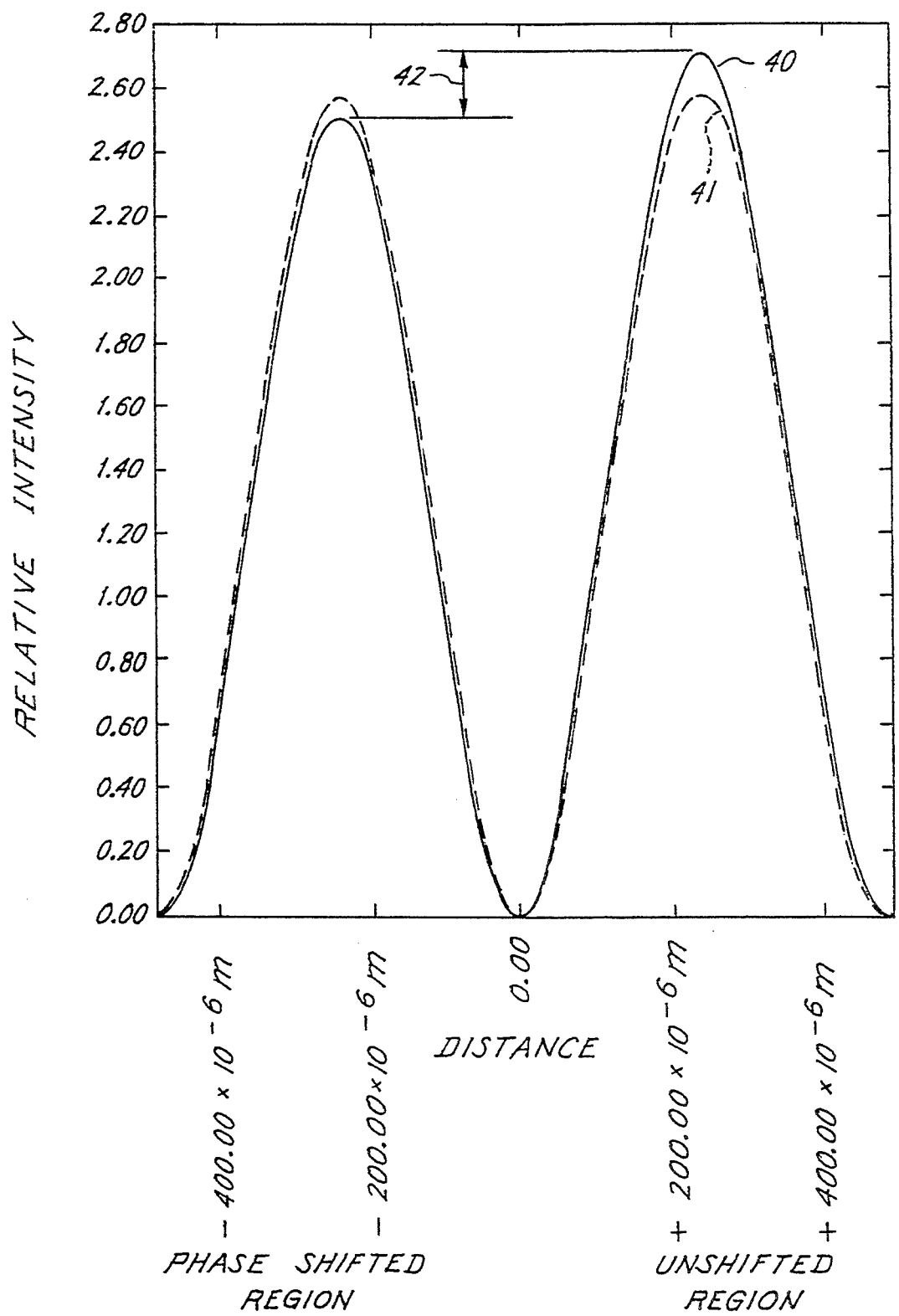

PHASE SHIFTING MASK STRUCTURE WITH ABSORBING/ATTENUATING SIDEWALLS FOR IMPROVED IMAGING

This application is a continuation of application Ser. No. 08/007,638, filed Jan. 21, 1993, now abandoned.

BACKGROUND OF THE INVENTION

1. Field of the Invention

The present invention relates to the field of fabricating photomasks for use in the manufacture of semiconductor devices and, more particularly, to the fabrication of phase shifting photomasks for use in submicron lithography techniques.

2. Related Applications

This application is related to copending applications entitled, "Method of Fabricating Phase Shifters with Absorbing/Attenuating Sidewalls Using An Additive Process," Ser. No. 007,640, filed Jan. 21, 1993; and copending application entitled "Phase Shifting Mask Structure with Multilayer Optical Coating for Improved Transmission", Ser. No. 007,639, filed Jan. 21, 1993.

3. Prior Art

Various techniques are known in the prior art for manufacturing devices on a semiconductor wafer, such as a silicon wafer. Typically, lithography processes are utilized to overlay a pattern(s) onto the wafer. Each pattern provides for selected portions of the wafer to undergo a particular lithographic process, such as deposition, etch, implant, etc. Photomasks (masks) are generally utilized to overlay a particular pattern on the wafer or a layer formed on the wafer. Generally a number of these masks are required for manufacturing a complete device on the wafer.

The earlier prior art lithography techniques rely upon optical techniques in which light is passed through a mask to overlay a pattern on the wafer. Generally, a pattern on the mask equated to a pattern design appearing on the surface of the wafer. However, as the semiconductor technology evolved to allow ever smaller device structures to be fabricated on a wafer, it became increasingly difficult to continue to use the standard optical techniques. It is generally theorized that as device features approach submicron dimensions of 0.25 microns and below, alternative techniques would be required to project patterns onto a wafer.

Due to the limitation imposed by the wavelength of light, resolution at the edges of these patterns tend to degrade when ordinary optical techniques are employed. Standard optical techniques utilizing ultra violet (UV) light will extend the lower range, but still fall short of desired resolution at extremely low ranges (under 0.25 microns). It was generally believed that technologies employing shorter wavelength would ultimately be required for lithography. A number of approaches have been suggested with x-ray lithography being viewed as the technology for use at these low submicron ranges.

However, recent experimentation in the area of phase shifting masks (PSMs) have shown that the PSM technology can be employed to extend the range of optical techniques currently being utilized. That is, the current I-line (at a wavelength of 356 nanometers) and deep ultra violet, or DUV (at a wavelength of 248 nanometers), optical photolithography techniques can be used with the phase shifting photomasks to provide the requisite resolution with sufficient depth of focus for fabricating semiconductor devices having dimensions in the order of 0.25 microns and below. It is believed that resolutions in the order of 0.1 micron resolution levels can be obtained with sufficient focus latitude by the use of ordinary lithography techniques when phase shifting techniques are applied.

It is generally understood that the technique for improving resolution in photolithography by the use of phase-shifting masks was first proposed by Levenson et al., ("Improving Resolution in Photolithography with a Phase-Shifting Mask", IEEE Transactions on Electron Devices, Vol. ED-29, No. 12, December 1982, pp. 1828–1836) and later implemented by Terasawa et al. ("0.3-micron optical lithography using a phase-shifting mask", Proceedings of SPIE, Vol. 1088 Optical/Laser Microlithography II, 1989, pp. 25–32).

The conventional PSM comprises of creating phase shifting regions in the transparent areas of a photomask. These phase-shifting regions are formed either by depositing transparent films of appropriate thickness and then patterning them over the desired transparent areas using a second level lithography and etch technique or by etching vertical trenches into the quartz substrate. In both of these instances, the "edges" or ("walls") between the phase shifted and unshifted regions mostly result in a transition between high and low refractive index regions.

This sharp transition of the refractive index and the three dimensional structure cause scattering of light due to internal reflections at the edges and causes the transmitted light intensity and spatial profile to vary between the shifted region and the unshifted region and leads to the "waveguiding" effect. The "waveguiding" effect results in the "funnelling" of light into a narrower region in the "phase shifted" areas thereby causing nonuniformity in the aerial image spatial profiles. Consequently, the imaging characteristics of conventional PSMs and uniformity of line-widths are degraded and is less than optimum. This degradation in linewidth uniformity also leads to problems with maintaining a desired aerial image in exposure characteristics across an entire field.

It is appreciated that a technique that would reduce the scattering of light at the transition regions and eliminate the waveguiding effect would provide for a PSM having improved image and exposure characteristics, as well as maintaining a desired uniformity of linewidths across the entire printed image field.

SUMMARY OF THE INVENTION

A PSM structure having absorbing/attenuating sidewalls along the shifter region in order to improve resolution, linewidth uniformity and depth of focus is described. The PSM of the present invention utilizes shifters in which trenches are formed in a quartz substrate to provide the 180° phase shift. However, the invention can be readily extended to deposited film shifters as well.

Once the trenches are patterned and formed in the quartz, the sidewalls of the trenches are coated with a light absorbing or attenuating material. The scattering effect experienced at these edges in the prior art PSM are now reduced or eliminated due to the absorption of the light by the sidewalls in the PSM of the present invention. This absorption of light at the sidewalls also creates a "lossy" waveguide thereby eliminating the resonances and hence eliminating the waveguiding effect.

BRIEF DESCRIPTION OF THE DRAWINGS

FIG. 3 is a graphic illustration comparing light intensity profiles for the PSMs shown in FIGS. 1 and 2.

DETAILED DESCRIPTION OF THE PREFERRED EMBODIMENT

A phase shifting mask (PSM) with light absorbing or attenuating sidewalls is described. In the following description, numerous specific details are set forth, such as specific structures, layers, materials, etc., in order to provide a thorough understanding of the present invention. However, it will be obvious to one skilled in the art that the present invention may be practiced without these specific details. In other instances, well known processes and structures have not been described in detail in order not to unnecessarily obscure the present invention.

Figure 1A:
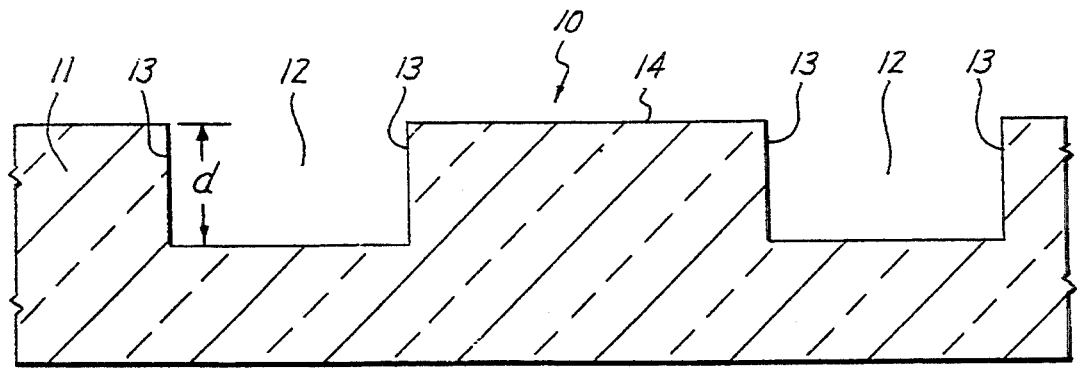
FIG. 1A is a cross-sectional diagram showing a prior art PSM using a quartz substrate with trenches formed therein as shifters.
Figure 1B:
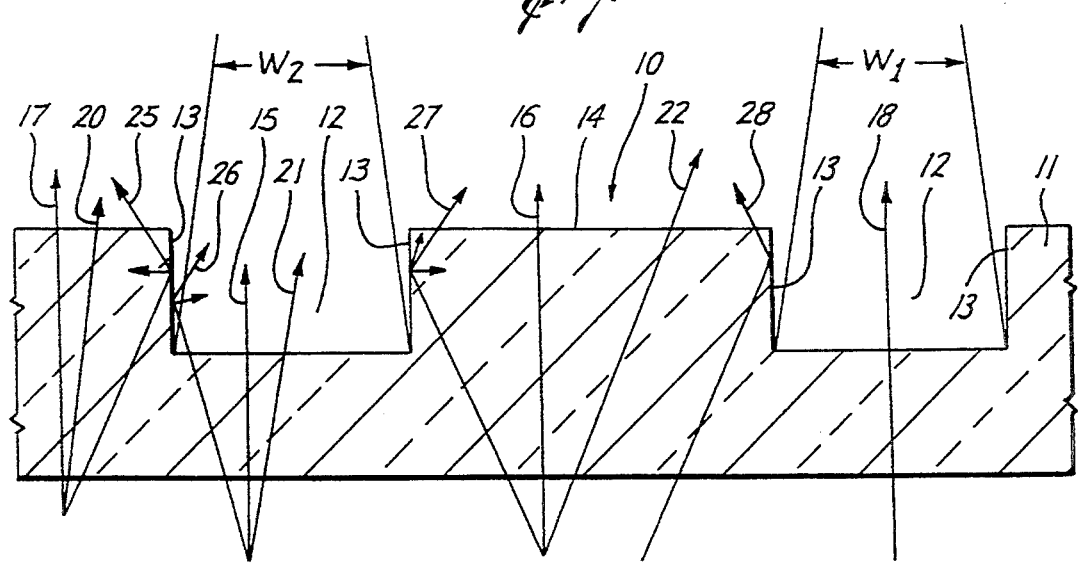
FIG. 1B is a cross-sectional diagram of the PSM of FIG. 1A and showing transmission of light therethrough, including the scattering experienced at edges of the trench.

Referring to FIGS. 1A and 1B, a prior art conventional phase shifting mask (PSM) 10 utilizing a vertical trench as a shifter is shown. PSM 10 is a simple unattenuated mask having a glass or quartz substrate 11 with openings 12 (which are also commonly referred to as trenches) formed in quartz 11. The region formed by each trench 12 provides sidewalls 13 which have a specified vertical depth denoted as distance "d" in FIG. 1A. The open trench 12 is typically in air, which has an index of refraction of 1.0, while the quartz substrate 11 typically has an index of refraction of approximately 1.5. Light traversing through substrate 11 and trench 12 (denoted by light ray 15 in FIG. 1B) will be out of phase in comparison to a light ray traversing completely through substrate 11 (as denoted by ray 16 in FIG. 1B). That is, the phase of light ray 15 is shifted by some phase angle (usually 180°) when compared to the phase of ray 16. The resulting phase shift is achieved by the presence of trench 12. Therefore, each trench 12 functions as the phase shifter and is typically referred to as a "shifter" for the prior art PSM 10.

In FIG. 1B, the "edge" and "edge scattering" problem associated with prior art PSM 10, leading to undesirable internal reflections, is exemplified. Light rays, such as rays 15–18 traverse through mask 10 at a substantially perpendicular angle to the transitioning edge 14 of mask 10. These rays 15–18 have the minimum scattering effects. Even rays which are not normal to edge 14, such as rays 20–22, provide minimum of scattering effects. However, light rays, such as rays 25–28, which reach the sidewalls 13 can result in considerable scattering due to the angle of incidence of light striking the edge formed by the sidewalls. At times, this edge scattering can result in significant degradation to the lithography resolution, thereby noticeably affecting the image and exposure characteristics.

Furthermore, the scattering at the edges can cause nonuniformity in linewidths of the printed image. For example, in FIG. 1B, distortions in the linewidth of the printed image due to distortions from the shifter regions, are shown as widths $w_1$ and $w_2$ and are the result of edge scattering and "waveguiding" effects. These distortions, depicted by $w_1$ and $w_2$, can then result in nonuniformity of the lines projected on the printed image.

Figure 2A:
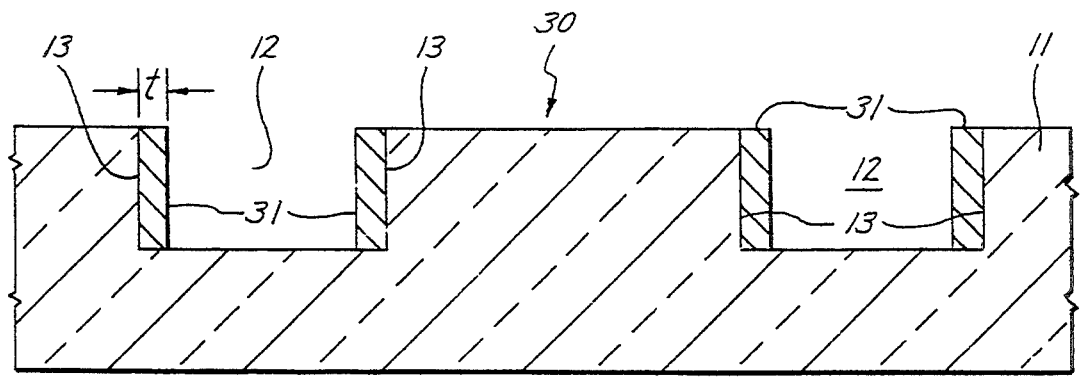
FIG. 2A is a cross-sectional diagram showing a PSM of the present invention in which a light absorbing sidewall is formed in trench regions to reduce the scattering.

Referring to FIGS. 2A and B, a phase shifting mask 30 of the present invention is shown. PSM 30 is formed similarly to that of the prior art mask described in FIGS. 1A–B, however, mask 30 now includes a light absorbing or attenuating sidewall 31 to address the scattering problem noted with the prior art PSM 10 of FIGS. 1A–B. The absorbing/attenuating sidewall 31 is disposed along the vertical ("sidewall") portion of trench 12. The absorbing/attenuating sidewall 31 is formed from a conducting material in order to provide a conducting region to fully absorb or attenuate (partially absorb in order to attenuate) light rays penetrating the sidewall. This aspect of the invention is better illustrated in FIG. 2B.

Figure 2B:
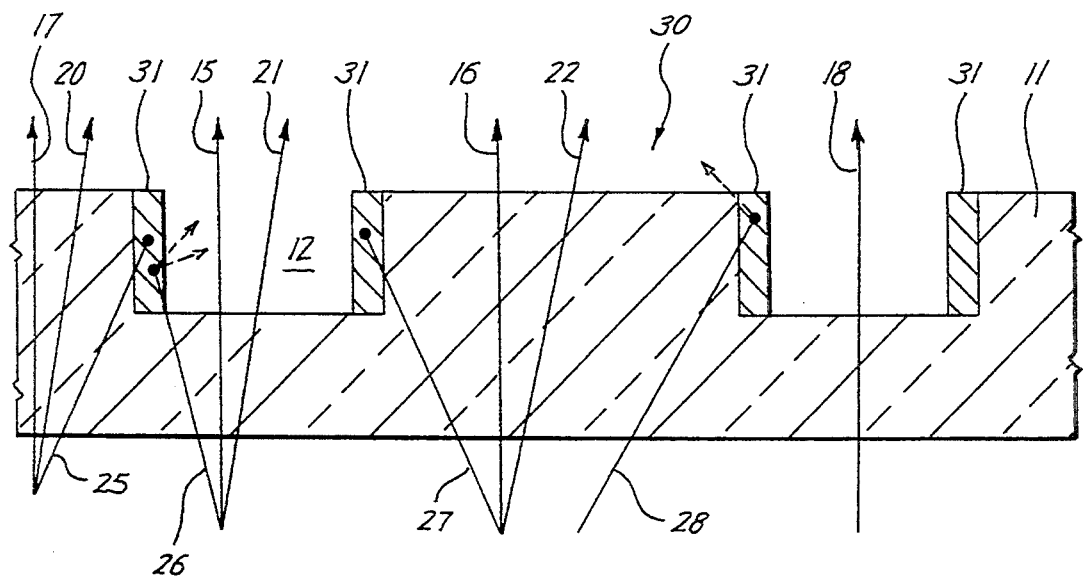
FIG. 2B is a cross-sectional diagram of the PSM of FIG. 2A and showing transmission of light therethrough, including the absorption at the trench sidewalls.

Using the same reference numerals associated with the light rays depicted in FIG. 1B, FIG. 2B shows what actually happens to the light rays 25–28 which impact the sidewall 31. Instead of scattering due to the edge effects of the sidewall, these rays 25–28 are substantially absorbed by the absorbing sidewall 31. The light is fully absorbed (shown by rays 25 and 27) or partially absorbed so that the light is attenuated (shown by rays 26 and 28). The absorption of light by absorbing sidewalls 31 altogether prevents or reduces the scattering problem encountered with the prior art PSM 10. Thus, it prevents or inhibits total internal reflections and especially for partially coherent illumination, eliminates the "waveguiding" effects by creating "lossy" sidewalls which suppress resonances on the shifted regions. The elimination of waveguiding using "lossy" sidewalls also makes the spatial profiles independent of shifter width or depth (i.e., removes geometrical dependance).

Referring to FIG. 3, a graphic illustration comparing the light intensity between the phase shifted and unshifted regions for the conventional PSM 10 and PSM 30 of the present invention utilizing the absorbing sidewall 31 is shown. On the abscissa, distance left of the origin depict the phase-shifted region (i.e., the presence of trench 12), while the unshifted region (i.e., absence of trench 12) is depicted to the right of the origin. The edge is shown as the origin with distances shown in $10^{-6}$ meters. The ordinate provides the amplitude of relative light intensity.

Two conditions are shown in the graph of FIG. 3. Curve 40 shows the intensity profile of the aerial image projected onto the target, such as a semiconductor wafer without the absorbing sidewall 31, while curve 41 shows equivalent intensity profile but with the presence of the absorbing sidewall 31. Without the absorbing/attenuating sidewall 31, the prior art PSM 10 results in the difference 42 of the two intensity profiles. This difference can degrade the resolution and/or the depth of focus of the aerial image as well as causing a nonuniformity of linewidth in the printed image. However, with the absorbing sidewall 31, the PSM 30 of the present invention is shown having fairly equal intensity profiles for both the phase-shifted and unshifted regions.

The particular example of FIG. 3 is that of a chromeless glass PSM operating at DUV wavelength of 245 nm with 5× magnification where $\sigma$ (partial coherence)=0, NA (numerical aperture)=0.5 and df (depth of focus)=0. The material for the absorbing sidewall 31 is chromium (Cr) having a thickness t of approximately 200 angstroms.

It is to be noted that a variety of conducting materials can be readily utilized to form the absorbing/attenuating sidewall 31 of the present invention. However the preferred material is metal, metal alloy or silicide. The design criteria is that the absorbing factor (K) of the metallic material, which is known by $K=4\pi\sigma/\lambda$, where $\sigma$ is electrical conductivity and $\lambda$ is the wavelength of light, should be such that the incoming light intensity ($I_o$) is reduced to $1/e$ of its value within a thickness t (t being the thickness of the absorbing sidewall 31 as is noted in FIG. 2A). The thickness t is commonly referred to as the "skin" depth and typical values vary within a range of 100 to 500 angstroms for most conducting materials over the wavelength range from deep ultraviolet to I-line and thereby can be present without significantly perturbing the forward transmission characteristics of the PSM 30.

It is to be appreciated that various light absorbing materials which are typically conducting materials, can be utilized for the absorbing sidewall 31 of the present invention, as is noted in the description above. Typical example materials are molybdenum, chromium, aluminum and gold, as well as their alloys and silicides. Silicon can also be utilized but provides less absorption than metals for comparable thicknesses. An advantage of using silicon is that it is easier to deposit and etch than metallic materials and the thickness control is less stringent. The thickness t of these materials should be of appropriate value to allow sufficient absorption of light at the wavelength of interest for a given light intensity, as was noted above. For metals, thickness t would be toward the lower end of the range (100 angstroms) while thickness t for silicon will be toward the middle and upper end of the range (300–500 angstroms).

The presence of such a metallic or silicon coating along the sidewall of trench 12 provides for a number of advantages. These advantages include improving the imaging characteristics of the PSM by reducing sidewall scattering, reducing "waveguiding" effects, improving resolution, and improving the depth of focus (by making the aerial image conform closer to the ideal. Other advantages include improving repairability of masks in a repair system (such as a Focussed Ion Beam or Laser Repair System) by providing a conductive coating at edges and improving edge detection and contrast in inspection systems. The conductive layer provides an etch "stop" for stopping the ion beam milling process with excellent selectivity.

The reason for this is that the optical "contrast" in an ion-beam mask repair system is significantly enhanced by a glass-to-metal transition than a glass-to-glass transition. Furthermore, the PSM 30 of the present invention is fairly easy to fabricate.

A number of techniques can be utilized to form the absorbing/attenuating sidewall 31. Metallic, as well as silicon material can be deposited into the trench 12 of the prior art PSM 10 and anisotropically etched in order to form the absorbing sidewall 31 of the present invention. However, the preferred method for forming such an absorbing sidewall is disclosed in one of the aforementioned co-pending application entitled, "Method of Fabricating Phase Shifters with Absorbing/Attenuating Sidewalls Using An Additive Process", Ser. No. 007,640, filed Jan. 21, 1993, which is incorporated by reference herein.

It is to be appreciated that although a particular PSM 30 has been described herein, absorbing sidewalls 31 using conductive and semiconductive materials can be readily implemented in a variety of situations involving PSMs. It is to be further appreciated that although PSM 30 is shown as a conventional unattenuated PSM, the present invention can be readily utilized with other types of PSMs, such as Levenson, Rim, subresolution and attenuated PSMs, without departing from the scope and spirit of the present invention. Thus, this invention can be readily extended to deposited film shifters as well.

Thus, a phase shifting mask structure with absorbing/attenuating sidewalls for improved imaging is described.

We claim:

1. A photolithography mask having phase shifting regions disposed thereon for phase shifting incident light transmission therethrough such that a phase difference occurs between light traversing through said phase shifting regions as compared to other regions of said mask, said other regions being defined as nonshifting regions, comprising:
   a substrate having vertical trenches formed therein, wherein said trenches function as said phase shifting regions, said trenches having vertical sidewalls which delineate a separation between said phase shifting and nonshifting regions;
   conductive regions being formed along sidewalls of said vertical trenches for absorbing or attenuating light energy impinging on said sidewalls;
   wherein said conductive regions inhibit scattering of light within said phase shifting regions in order to improve resolution of a projected image field.

2. The photolithography mask of claim 1 wherein said conductive regions are formed from a metallic material.

3. The photolithographic mask of claim 1 wherein said conductive regions are formed from a material selected from a group consisting of molybdenum, chromium, aluminum, gold, their alloys and their silicides.

4. The photolithography mask of claim 1 wherein said conductive regions are formed from silicon.

5. A photolithography mask, having phase shifting regions on said mask for phase shifting incident light transmission therethrough in order to provide a phase difference from light transmission through nonshifting regions of said mask, for projecting an image pattern utilizing phase shifting techniques comprising:
   a substrate having a plurality of vertical trenches formed therein, wherein said trenches function as said phase shifting regions, said trenches having vertical sidewalls which delineate a separation between said phase shifting and nonshifting regions;
   conductive regions being formed along said sidewalls of said vertical trenches for absorbing at least a portion of light energy impinging on said sidewalls;
   wherein said conductive regions inhibit scattering of light within said phase shifting regions in order to improve resolution and provide uniformity of linewidth in said image pattern.

6. The photolithography mask of claim 5 wherein said substrate is formed from a dielectric material.

7. The photolithography mask of claim 6 wherein a thickness of said conductive regions is in the range of 100-500 angstroms.

8. The photolithography mask of claim 7 wherein said conductive regions are formed from a metallic material.

9. The photolithographic mask of claim 7 wherein said conductive regions are formed from a material selected from a group consisting of molybdenum, chromium, aluminum, gold, their alloys and their silicides.

10. The photolithography mask of claim 7 wherein said conductive regions are formed from silicon.

11. A photolithography mask, having phase shifting regions on said mask for phase shifting incident light transmission therethrough in order to provide a phase difference of 180° from light transmission through nonshifting regions of said mask, for projecting an image pattern utilizing phase shifting techniques comprising:
a substrate having a plurality of vertical trenches formed therein, wherein said trenches function as said phase shifting regions, said trenches having vertical sidewalls which delineate a separation between said phase shifting and nonshifting regions;
conductive regions being formed along said sidewalls of said vertical trenches for attenuating light energy impinging on said sidewalls;
wherein said conductive regions inhibit scattering of light within said phase shifting regions in order to improve resolution and provide uniformity of linewidth in said image pattern.

12. The photolithography mask of claim 11 wherein said substrate is formed from a dielectric material.

13. The photolithography mask of claim 12 wherein a thickness of said conductive regions is in the range of 100-500 angstroms.

14. The photolithography mask of claim 12 wherein said conductive regions are formed from a metallic material.

15. The photolithographic mask of claim 12 wherein said conductive regions are formed from a material selected from a group consisting of molybdenum, chromium, aluminum, gold, their alloys and their silicides.

16. The photolithography mask of claim 12 wherein said conductive regions are formed from silicon.

* * * * *